United States Patent
Sung et al.

(10) Patent No.: US 8,343,278 B2
(45) Date of Patent: Jan. 1, 2013

(54) MASK ASSEMBLY AND DEPOSITION AND APPARATUS FOR A FLAT PANEL DISPLAY USING THE SAME

(75) Inventors: Dong-Young Sung, Yongin (KR); Dae-Sik Jang, Yongin (KR)

(73) Assignee: Samsung Display Co., Ltd, Yongin, Gyeonggi-Do (KR)

( * ) Notice: Subject to any disclaimer, the term of this patent is extended or adjusted under 35 U.S.C. 154(b) by 288 days.

(21) Appl. No.: 12/656,595

(22) Filed: Feb. 4, 2010

(65) Prior Publication Data

US 2010/0192856 A1 Aug. 5, 2010

(30) Foreign Application Priority Data

Feb. 5, 2009 (KR) .................. 10-2009-0009344

(51) Int. Cl.
 C23C 16/00 (2006.01)
 B05C 11/11 (2006.01)
(52) U.S. Cl. .................. 118/720; 118/721; 118/504
(58) Field of Classification Search ............. 118/504, 118/720, 721
 See application file for complete search history.

(56) References Cited

U.S. PATENT DOCUMENTS

| | | | |
|---|---|---|---|
| 6,955,726 B2 * | 10/2005 | Kang et al. | 118/504 |
| 2003/0101932 A1 * | 6/2003 | Kang | 118/504 |
| 2006/0012290 A1 * | 1/2006 | Kang | 313/504 |
| 2006/0103289 A1 | 5/2006 | Kim et al. | |

FOREIGN PATENT DOCUMENTS

| | | |
|---|---|---|
| CN | 1439916 A | 9/2003 |
| CN | 1776525 A | 5/2006 |
| CN | 101280411 A | 10/2008 |
| JP | 09-320758 A | 12/1997 |
| JP | 10-050478 A | 2/1998 |
| JP | 2003-064467 A | 3/2003 |
| JP | 2004-014513 A | 1/2004 |
| JP | 2004-335382 A | 11/2004 |
| JP | 2005-165015 A | 6/2005 |
| JP | 2006-216289 A | 8/2006 |
| JP | 2006-294280 A | 10/2006 |
| JP | 2007-291461 A | 11/2007 |
| KR | 10-2006-0018343 A | 3/2006 |
| KR | 10-2006-0055613 A | 5/2006 |
| KR | 10-2006-0055619 A | 5/2006 |
| KR | 10-2008-0054741 A | 6/2008 |
| KR | 10-2009-0053417 A | 5/2009 |

OTHER PUBLICATIONS

English Translation JP 2004-101932, Tsuchiya et al dated Nov. 25, 2004.*

* cited by examiner

*Primary Examiner* — Rakesh Dhingra
(74) *Attorney, Agent, or Firm* — Lee & Morse, P.C.

(57) ABSTRACT

A mask assembly includes a mask frame, the mask frame having an opening and a frame surrounding the opening, a pattern mask on the mask frame, the pattern mask including a pattern portion having at least one pattern overlapping the opening and a welding portion attached to the frame, and at least one support bar crossing the opening and attached to the pattern mask.

18 Claims, 3 Drawing Sheets

MASK ASSEMBLY AND DEPOSITION AND APPARATUS FOR A FLAT PANEL DISPLAY USING THE SAME

BACKGROUND

1. Field

Example embodiments relate to a mask assembly and a deposition apparatus for a flat panel display using the same. More particularly, example embodiments relate to a mask assembly and a deposition apparatus for a flat panel display using the same that are capable of preventing deformation of a pattern of the mask assembly due to the weight of a substrate during a deposition process and improving deposition precision.

2. Description of the Related Art

Flat panel display devices have been used as alternative display devices for cathode ray tube display devices due to their lightweight and slim characteristics. Examples of flat panel display devices may include liquid crystal display devices (LCDs), organic light emitting diode (OLED) display devices, and so forth. Among the flat panel display devices, e.g., the OLED display devices may have better brightness and larger viewing angle than the LCDs and may have a super-slim structure due to removal of a backlight unit.

The OLED display device may operate using a phenomenon in which an electron injected from a cathode into an organic thin film may be re-coupled with a hole injected from an anode to form an exciton. A specific waveform of light may be generated from the exciton energy to realize images. The OLED display device may include OLEDs having R, G and B organic emission layers in order to display full-color.

In order to selectively form a cathode, an anode, an organic thin film, etc., on a substrate of a conventional OLED display device, e.g., formed of glass, stainless steel or synthetic resin, a photolithography method or a deposition method may be used. For example, in the photolithography method, a photoresist may be applied to a certain region of the substrate, followed by wet-etching or dry-etching thereof to form predetermined patterns on the substrate. However, in the photolithography method, moisture may be introduced into the photoresist during a photoresist separation process or an etching process. Therefore, the organic thin film of the OLED display device may deteriorate due to the moisture in the photoresist.

In another example, in the deposition method, a mask assembly having a pattern including a plurality of slits may be aligned on the substrate, followed by material deposition, e.g., organic light emission layers emitting R, G and B colors deposited in a predetermined pattern, onto the substrate through the slits. However, in a conventional deposition apparatus for a flat panel display device using a conventional mask assembly, a center portion of the substrate may be bent toward the mask assembly due to weight of the substrate during the deposition process. As such, the pattern mask of the mask assembly may be pressed by the substrate and may be deformed, thereby causing inaccurate alignment and deposition of material on the substrate.

SUMMARY

Embodiments are therefore directed to a mask assembly and a deposition apparatus for a flat panel display using the same, which substantially overcome one or more of the problems due to the limitations and disadvantages of the related art.

It is therefore a feature of an embodiment to provide a mask assembly that is capable of preventing deformation of a pattern of the mask assembly due to a weight of a substrate thereon during a deposition process.

It is therefore another feature of an embodiment to provide a mask assembly that is capable of improving deposition precision therethrough.

It is yet another feature of an embodiment to provide a deposition apparatus for a flat panel display device using a mask assembly having one or more of the above features.

At least one of the above and other features and advantages may be realized by providing a mask assembly, including a mask frame having an opening and a frame surrounding the opening, a pattern mask including a pattern portion having at least one pattern and a welding portion welded to the frame, and a support bar crossing the opening and welded to the pattern mask.

The welding portion may extend in a first direction, the first direction being parallel to a longitudinal side of the pattern mask. The support bar may extend in a second direction to cross the opening, the second direction being perpendicular to the first direction. The mask assembly may include a plurality of support bars, the support bar being spaced apart from each other along the first direction. The frame may have grooves for accommodating ends of the support bar. The grooves may have a depth substantially equal to a thickness of the support bar. The pattern mask may be a fine metal mask. The support bar may include a substantially same material as the mask frame. A welding point between the pattern mask and the support bar may be disposed between the patterns of the pattern mask. The pattern may include at least one slit. The bar may be between the opening and the mask pattern.

At least one of the above and other features and advantages may be also realized by providing a deposition apparatus for a flat panel display, including a chamber, a deposition source disposed at a lower portion of the chamber, and a mask assembly disposed over the deposition source and supporting a substrate, wherein the mask assembly includes a mask frame having an opening and a frame surrounding the opening, a pattern mask including a pattern portion having at least one pattern and a welding portion welded to the frame, and a support bar crossing the opening and welded to the pattern mask.

The welding portion may extend in a first direction, the first direction being parallel to a longitudinal side of the pattern mask. The support bar may extend in a second direction to cross the opening, the second direction being perpendicular to the first direction. The mask assembly may include a plurality of support bars, the support bar being spaced apart from each other along the first direction. The frame may have grooves for accommodating ends of the support bar. The grooves may have a depth substantially equal to a thickness of the support bar. The pattern mask may be a fine metal mask. The support bar may include a substantially same material as the mask frame. A welding point between the pattern mask and the support bar may be disposed between the patterns of the pattern mask. The pattern may include at least one slit.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
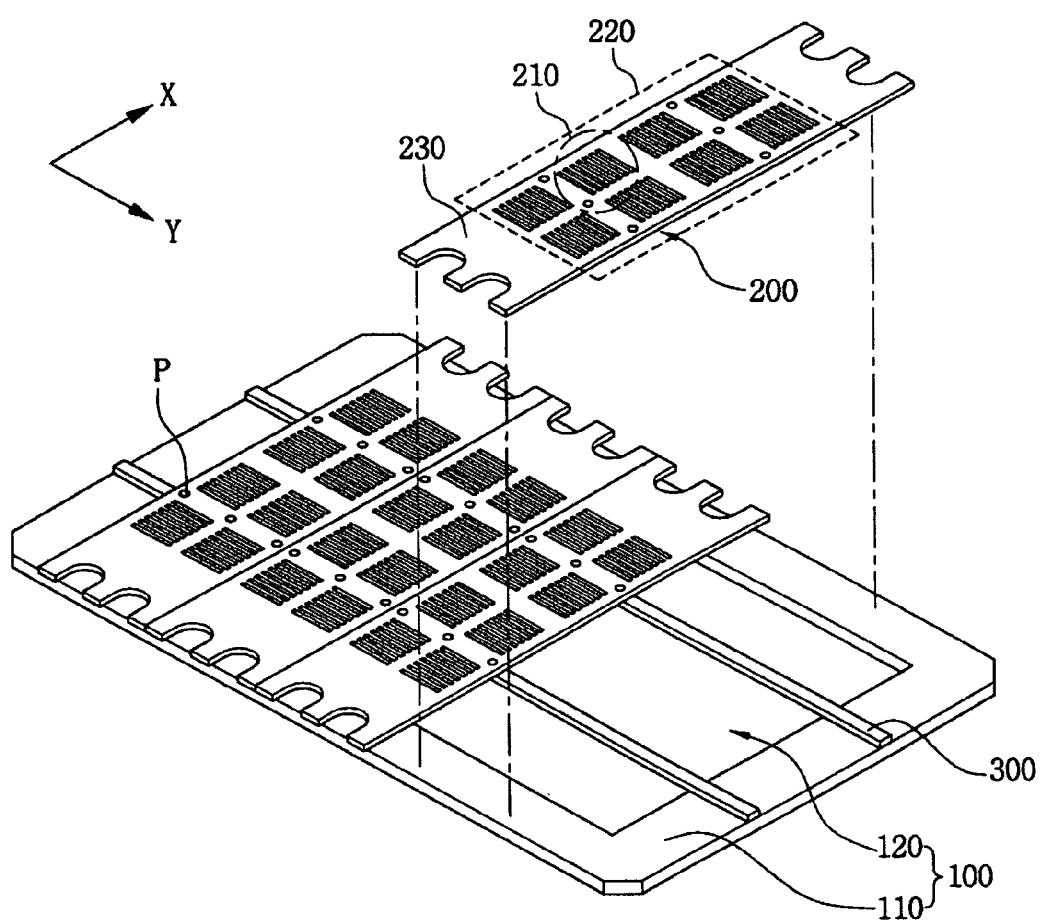
FIG. 1A illustrates a perspective view of a mask assembly in accordance with an exemplary embodiment of the present invention.

Korean Patent Application No. 10-2009-0009344, filed on Feb. 5, 2009, in the Korean Intellectual Property Office, and entitled: "Mask Assembly and Deposition Apparatus for Flat Panel Display Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
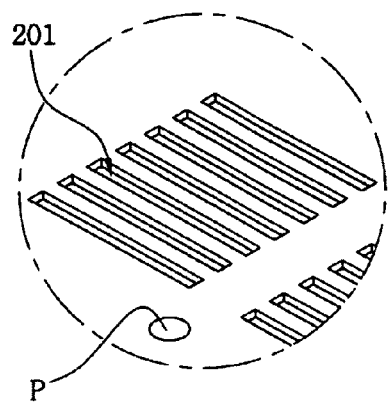
FIG. 1B illustrates an enlarged perspective view of a pattern of the mask assembly in FIG. 1A.
Figure 2:
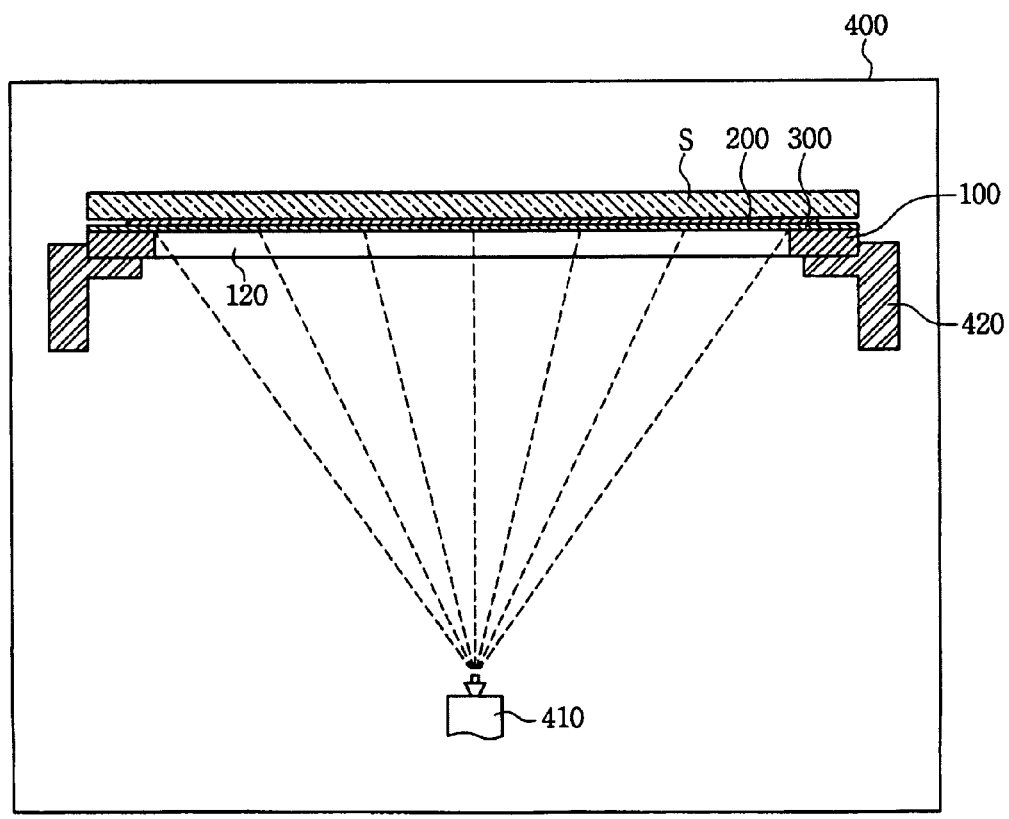
FIG. 2 illustrates a schematic view of a deposition apparatus for a flat panel display using a mask assembly in accordance with an exemplary embodiment of the present invention.

FIG. 1A illustrates a perspective view of a mask assembly in accordance with an exemplary embodiment, FIG. 1B illustrates an enlarged perspective view of a pattern of the mask assembly of FIG. 1A, and FIG. 2 illustrates a schematic view of a deposition apparatus for a flat panel display using a mask assembly in accordance with an exemplary embodiment of the present invention.

Referring to FIGS. 1A and 1B, a mask assembly in accordance with an exemplary embodiment may include a mask frame 100 having an opening 120, a plurality of pattern masks 200 extending in a first direction, e.g., a longitudinal side of each pattern mask 200 may extend along the x-axis in FIG. 1A, across the opening 120, and a support bar 300 extending in a second direction perpendicular to the first direction, e.g., along the y-axis in FIG. 1A, to cross the opening 120. The plurality of pattern masks 200 may be welded to a frame 110 of the mask frame 100. It is noted that while FIG. 1A illustrates a plurality of pattern masks 200 extending in the first direction and welded to the mask frame 100, other configurations of the pattern masks, e.g., the mask assembly may include a single pattern mask having an area corresponding to the opening 120 and welded to the frame 110 of the mask frame 100 to overlap the entire opening 120 in one or more of the first and second direction, is included within the scope of the present invention.

The mask frame 100 may include the opening 120 and the frame 110. The opening 120 may be sufficiently large to overlap a display region on a substrate of a display device, e.g., the opening 120 may be a single opening having an area that completely overlaps a display region on a substrate of a display device. The frame 110 may surround the opening 120, and may be welded to the pattern masks 200. The frame 110 of the mask frame 100 may be formed of a strong material resistant to deformation from a compression force, i.e., a strong metal material, so that an end of the pattern mask 200 may be fixed to the frame 110, e.g., through welding.

The pattern masks 200, e.g., each pattern mask 200, may include a pattern portion 220 having at least one pattern 210 corresponding to the opening 120, and a welding portion 230 extending in the first direction and welded to the frame 110. For example, the pattern portion 220 may extend along the first direction to overlap at least a portion of the opening 120, and the welding portion 230 may extend along the first direction from the pattern portion 220 to the frame 110. For example, the welding portion 230 may be integral with the pattern portion 220 and may connect the pattern portion 220 to the frame 110 via welding, e.g., the welding portion 230 may extend from each end of the pattern portion 220 to a respective side of the frame 110 to completely overlap the opening 120. The pattern 210, e.g., each pattern 210, may include at least one slit 201, e.g., a plurality of slits 201, to provide openings for material deposition. For example, as illustrated in FIGS. 1A-1B, each pattern 210 may include a plurality of slits 201 extending along the second direction and spaced apart from each other along the first direction. Here, the pattern mask 200 may be a fine metal mask formed of a metal thin film, e.g., one or more of steel use stainless (SUS), invar, nickel, cobalt, and an alloy thereof. If a plurality of pattern masks 220 are used, as illustrated in FIG. 1A, the pattern masks 200 may be positioned adjacent to each other to overlap the opening 120, e.g., the entire opening 120.

The support bar 300 may be disposed to cross the opening 120 of the mask frame 100 to prevent deformation of the pattern masks 200. For example, as illustrated in FIG. 1A, the support bar 300 may be welded onto the frame 110, e.g., onto a surface of the frame 110 facing the pattern mask 200, so end portions of the support bar 300 may overlap the frame 110. For example, the support bar 300 may extend along an entire length of the frame 100, i.e., as measured along the second direction, so each end portion of the support bar 300 may overlap, e.g., completely overlap, a respective frame width portion. In this respect, it is noted that the frame width portion of the frame 110 may be defined between an outer edge of the frame 110, i.e., an edge facing an exterior of the frame 110, and an inner edge of the frame 110, i.e., an edge facing the opening 120. The support bar 300 may be between the frame 110 and the pattern masks 220.

As illustrated in FIG. 1A, when a plurality of pattern masks 200 is welded to the mask frame 100, the support bar 300 may cross the opening 120 in the second direction perpendicular to the first direction, e.g., a longitudinal side of the support bar 300 may extend along the second direction to cross the longitudinal side of the pattern masks 200. Here, in order to prevent the patterns 210 of the pattern mask 200 from being blocked by the welding between the support bar 300 and the pattern mask 200, the support bar 300 may be welded to the pattern masks 200 between the patterns 210 of the pattern mask 200. In other words, as illustrated in FIG. 1A, the support bar 300 may overlap a part of the pattern portion 220 between two adjacent patterns 210, so the support bar 300 may not overlap the slits 201. For example, as illustrated in FIGS. 1A-1B, the support bar 300 may be positioned so that a welding point P between the support bar 300 and the pattern masks 200 is positioned between the patterns 210, e.g., between two patterns 210 adjacent to each other along the first direction.

A plurality of support bars 300 may be provided at predetermined intervals, e.g., two supports bars 300 may be spaced apart from each other along the first direction. The support bar 300 may have any suitable shape and cross-section, e.g., the support bar may have a circular or polygonal cross-section. For example, portions of the support bar 300 contacting predetermined areas of the pattern mask 200 may have a polygonal shape, so when pressure is applied to the pattern mask 200, the shape of the support bar 300 may prevent or substantially minimize damage to the pattern mask 200 due to the support bar 300 and may increase weldability between the support bar 300 and the pattern mask 200.

Referring to FIG. 2, a deposition apparatus for a flat panel display using a mask assembly in accordance with an exemplary embodiment may include a chamber 400, a deposition source 410 disposed at a lower portion of the chamber 400, and a mask assembly disposed over the deposition source 410 and supporting a substrate S. The mask assembly may be substantially the same mask assembly with the mask frame 100 and opening 120 described previously with reference to FIGS. 1A-1B. The deposition apparatus for a flat panel display may further include a separate fixing member 420 for fixing the mask assembly.

A thin film deposition process using the mask assembly in accordance with the present invention will be described with reference to FIG. 2. After fixing the mask assembly to a fixing member 420, the substrate S may be positioned on the pattern mask 200 of the mask assembly, i.e., the pattern mask 200 may be between the substrate S and the opening 120. Here, the substrate S may be spaced apart a predetermined gap from the pattern mask 200 by a separate holder (not shown), and may be positioned to completely overlap the opening 120 of the mask assembly.

Next, the deposition source 410 may be positioned to face the pattern masks 200 through the opening 120, e.g., a single opening 120. When a deposition material is injected or evaporated from the deposition source 410 disposed at the lower portion of the chamber 400, the deposition material may be deposited on the substrate S through the patterns 210 of the pattern masks 200 to form a certain pattern on the substrate S, i.e., a pattern corresponding to the patterns 210 of the pattern masks 200. Here, when the mask assembly is thermally expanded by heat in the chamber 400, in order to prevent separation and deformation of the support bar 300 due to difference in thermal expansion characteristics between the support bar 300 and the mask frame 110, the support bar 300 may be formed of a substantially same material as the mask frame 110.

At this time, due to the weight of the substrate S during the deposition process, stress may be generated from a center portion of the substrate S toward the deposition source 410. Since the pattern masks 200 supporting the substrate S may be welded to the support bar 300, the stress may be distributed by the support bar 300 supporting the pattern masks 200 to prevent deformation of the pattern masks 200.

Figure 3:
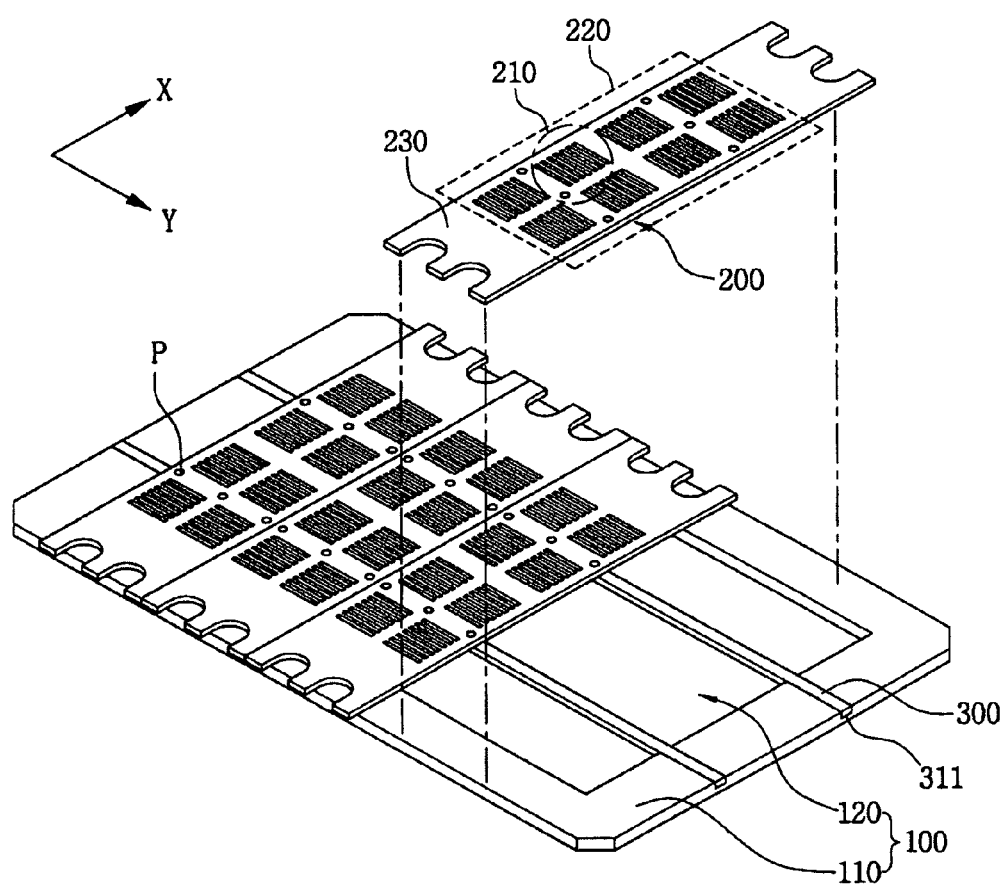
FIG. 3 illustrates a perspective view of a mask assembly in accordance with another exemplary embodiment of the present invention.

According to another example embodiment illustrated in FIG. 3, a mask assembly may be substantially the same as the mask assembly described previously with reference to FIGS. 1A-1B, with the exception of the structure of the frame of the mask frame. In particular, as illustrated in FIG. 3, the frame 110 of the mask frame 100 may include grooves 311. End portions of the support bars 300 may be inserted into the grooves 311. The grooves 311 may have a depth equal to the thickness of the support bars 300, so when the support bar 300 is fit in a corresponding groove 311, upper surfaces of the support bar 300 and frame 110 may be substantially coplanar, e.g., substantially level in the xy-plane. Formation of the grooves 311 in the frame 110 may facilitate formation of the support bar 300 on a substantially same level as the frame 110. Accordingly, a distance between the mask frame 110 and the pattern masks 200 may not be increased by the support bar 300, thereby facilitating welding between the frame 110 of the mask assembly and the welding portion 230 of the pattern masks 200. Further, a coupling force required for welding the welding portions 230 to the frame 110 may be decreased.

According to example embodiments, a mask assembly and a deposition apparatus for a flat panel display including the same may include a support bar crossing an opening of a mask frame and supporting a pattern mask including at least one pattern. The structure of the support bar and welding thereof to the pattern mask may facilitate distribution of stress and weight of the substrate over a larger area, so it may be possible to prevent or substantially minimize deformation of the pattern mask due to the weight of the substrate during a deposition process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A mask assembly, comprising:
a mask frame, the mask frame having an opening and a frame surrounding the opening;
a pattern mask on the mask frame, the pattern mask including:
a pattern portion having a plurality of patterns spaced apart from each other and overlapping the opening, and
a welding portion attached to the frame, wherein the welding portion extends in a first direction, the first direction being parallel to a longitudinal side of the pattern mask; and
at least one support bar crossing the opening and attached to the pattern mask, the support bar being positioned between patterns of the pattern mask,
wherein the support bar extends in a second direction to cross the opening, the second direction being perpendicular to a longitudinal side of the pattern mask.
2. The mask assembly as claimed in claim 1 wherein the support bar and the patterns of the pattern mask overlap completely different parts of the opening.
3. The mask assembly as claimed in claim 2, wherein the mask assembly includes a plurality of support bars, the support bars being spaced apart from each other along the first direction.
4. The mask assembly as claimed in claim 1, wherein the frame has grooves for accommodating ends of the support bar.
5. The mask assembly as claimed in claim 4, wherein the grooves have a depth substantially equal to a thickness of the support bar.
6. The mask assembly as claimed in claim 1, wherein the pattern mask is a fine metal mask.
7. The mask assembly as claimed in claim 1, wherein the support bar includes a substantially same material as the mask frame.

8. The mask assembly as claimed in claim 1, wherein a welding point between the pattern mask and the support bar is disposed between the patterns of the pattern mask.

9. The mask assembly as claimed in claim 1, wherein the pattern includes at least one slit.

10. The mask assembly as claimed in claim 1, wherein the support bar is between the opening and the mask pattern.

11. A deposition apparatus for a flat panel display, comprising:
   a chamber;
   a deposition source disposed at a lower portion of the chamber; and
   a mask assembly disposed over the deposition source and configured to support a substrate, the mask assembly including:
   a mask frame, the mask frame having an opening and a frame surrounding the opening;
   a pattern mask on the mask frame, the pattern mask including:
   a pattern portion having a plurality of patterns spaced apart from each other and overlapping the opening, and
   a welding portion attached to the frame, and
   at least one support bar crossing the opening and attached to the pattern mask, the support bar being positioned between patterns of the pattern mask,
   wherein the support bar extends in a region not overlapping any of the patterns of the pattern mask, and a plurality of welding points between the support bar and the pattern mask, spaced apart from each other along a direction of the support bar being disposed on the support bar between the plurality of patterns.

12. The deposition apparatus as claimed in claim 11, wherein the welding portion extends in a first direction, the first direction being parallel to a longitudinal side of the pattern mask.

13. The deposition apparatus as claimed in claim 12, wherein the support bar extends in a second direction to cross the opening, the second direction being perpendicular to the first direction.

14. The deposition apparatus as claimed in claim 13, wherein the mask assembly includes a plurality of support bars, the support bars being spaced apart from each other along the first direction.

15. The deposition apparatus as claimed in claim 11, wherein the frame has grooves for accommodating ends of the support bar.

16. The deposition apparatus as claimed in claim 15, wherein the grooves have a depth substantially equal to a thickness of the support bar.

17. The deposition apparatus as claimed in claim 11, wherein a welding point between the pattern mask and the support bar is disposed between the patterns of the pattern mask.

18. The deposition apparatus as claimed in claim 11, further comprising a fixing member for fixing the mask assembly.

* * * * *